US007799655B2

(12) United States Patent
Murakami et al.

(10) Patent No.: US 7,799,655 B2
(45) Date of Patent: Sep. 21, 2010

(54) METHOD FOR EVALUATION OF BONDED WAFER

(75) Inventors: Satoshi Murakami, Tokyo (JP); Nobuyuki Morimoto, Tokyo (JP); Tamio Motoyama, Tokyo (JP)

(73) Assignee: Sumco Corporation, Tokyo (JP)

( * ) Notice: Subject to any disclaimer, the term of this patent is extended or adjusted under 35 U.S.C. 154(b) by 415 days.

(21) Appl. No.: 12/037,057

(22) Filed: Feb. 25, 2008

(65) Prior Publication Data

US 2008/0220589 A1 Sep. 11, 2008

(30) Foreign Application Priority Data

Mar. 5, 2007 (JP) ............... 2007-054480

(51) Int. Cl.
*H01L 21/46* (2006.01)
(52) U.S. Cl. ............... 438/455; 438/456; 438/457; 438/458; 438/459
(58) Field of Classification Search ............... 438/455, 438/456, 457, 458, 459
See application file for complete search history.

(56) References Cited

U.S. PATENT DOCUMENTS

| | | | | |
|---|---|---|---|---|
| 4,878,957 A * | 11/1989 | Yamaguchi et al. | ......... | 148/33.3 |
| 5,238,875 A * | 8/1993 | Ogino | ......... | 438/459 |
| 5,374,564 A | 12/1994 | Bruel | | |
| 6,818,565 B1 * | 11/2004 | Sun et al. | ......... | 438/745 |
| 6,991,989 B2 * | 1/2006 | Lee et al. | ......... | 438/287 |
| 2003/0119278 A1 * | 6/2003 | McKinnell | ......... | 438/455 |
| 2004/0072446 A1 * | 4/2004 | Liu et al. | ......... | 438/719 |
| 2004/0087109 A1 * | 5/2004 | McCann et al. | ......... | 438/455 |
| 2006/0154442 A1 * | 7/2006 | de Souza et al. | ......... | 438/455 |
| 2006/0157079 A1 * | 7/2006 | Kim et al. | ......... | 134/1.1 |

(Continued)

FOREIGN PATENT DOCUMENTS

JP 5211128 A 8/1993

(Continued)

OTHER PUBLICATIONS

T. Jutarosaga et al., "Si-SiO2 interface formation in low-dose low-energy separation by implanted oxygen materials", Applied Surface Science, Elsevier, Amsterdam, NL, vol. 250, No. 1-4, pp. 168-181, Aug. 31, 2005.

(Continued)

*Primary Examiner*—Fernando L Toledo
*Assistant Examiner*—Ankush k Singal
(74) *Attorney, Agent, or Firm*—Sughrue Mion, PLLC

(57) ABSTRACT

A bonded wafer formed by directly bonding a wafer for active layer and a wafer for support substrate without an insulating film and thinning the wafer for active layer is evaluated by a method comprising steps of removing native oxide from a surface of an active layer in the bonded wafer, subjecting the bonded wafer to an etching with an etching liquid having an etching rate to a material constituting the wafer faster than that to an oxide of the material to remove at least a whole of the active layer, and detecting island-shaped oxides exposed by the etching, in which the etching is carried out so as to satisfy a relation of T≦X≦T+500 nm wherein T is a thickness of the active layer (nm) and X is an etching depth (nm) to detect the number and size of the island-shaped oxides.

4 Claims, 5 Drawing Sheets

U.S. PATENT DOCUMENTS

2006/0163200 A1* 7/2006 Sandhu et al. .................. 216/58
2007/0117281 A1* 5/2007 Endo et al. .................... 438/149

FOREIGN PATENT DOCUMENTS

JP          2000-031225 A    1/2000

OTHER PUBLICATIONS

European Search Report for counterpart EPC Application No. 08003037.2-1235 dated Aug. 11, 2009.
Korean Office Action dated Nov. 11, 2009 Issued in Corresponding Korean Patent Application 9-5-2009-047550321.

* cited by examiner

10mm

METHOD FOR EVALUATION OF BONDED WAFER

BACKGROUND OF THE INVENTION

1. Field of the Invention

This invention relates to a method for evaluating a bonded wafer formed by directly bonding a wafer for active layer to a wafer for support substrate without using an insulating film and thinning the wafer for active layer.

2. Description of the Related Art

Recently, semiconductor substrates having a SOI structure by forming a silicon layer or so-called active layer on an oxide film are adaptable for the speeding-up of devices and low in the power consumption and excellent in the pressure resistance, environmental resistance and the like, so that they are used as a wafer for high-performance LSI in electron devices. Particularly, it is required to produce bonded wafers having a higher quality accompanied with a high integration of the semiconductor device, and hence it is increasingly demanded to produce a bonded wafer by thinning a thickness of a buried oxide film (e.g. thickness of about 20 nm) as compared with the conventional SOI wafer.

Also, as a wafer used for a low power consumption device in subsequent generations, there is mentioned a novel bonded wafer formed by removing an oxide film from surfaces of a wafer for active layer and a wafer for support substrate with HF liquid or the like and directly bonding these wafers without using the oxide film and then thinning the wafer for active layer as disclosed, for example, in JP-A-H05-211128. Such a bonded wafer is noticed as a beneficial wafer in a point of the simplification of the production process and improvement of performances in a mixed crystal orientation substrate.

However, the bonded wafer formed by directly bonding without the insulating film as mentioned above has a problem that at the production step of the bonded wafer, native oxide or water on the surface of the wafer is locally aggregated to form island-shaped oxide, which partly remains in a bonded interface. The presence of such an oxide causes the deterioration of the device characteristics and forms a nucleus causing defects at the production step of the device to lower the chip yield or the like.

Therefore, when the bonded wafer is produced by direct bonding without the insulating film, it is required to suppress the formation of the oxide in the bonded interface as long as possible, but also it is an important subject matter to develop a method for detecting island-shaped oxides, which are apt to be generated in the bonded interface of the bonded wafer.

SUMMARY OF THE INVENTION

It is, therefore, an object of the invention to provide a method for evaluating a bonded wafer wherein the number and size of island-shaped oxides, which are apt to be generated in a bonded interface, can be detected in the defect evaluation of the bonded wafer formed by directly bonding a wafer for active layer and a wafer for support substrate without an insulating film and thinning the wafer for active layer.

The inventors have made various studies for solving the above problem, and found that in the bonded wafer formed by directly bonding the wafer for active layer and the wafer for support substrate without the insulating film, native oxide is removed from the surface of the active layer in the bonded wafer and then at least a whole of the active layer is removed by etching with an etching liquid having an etching rate to a material constituting the wafer faster than that to an oxide of the material, whereby the material constituting the wafer is first removed to make an outline of the island-shaped oxide clear and hence it is possible to detect the presence or absence of the island-shaped oxide, and also that the number and size of the island-shaped oxides can be accurately detected by adjusting an etching depth to a certain level before the island-shaped oxide exposed on the surface is miniaturized by excessive etching, and as a result, the invention has been accomplished.

In order to achieve the above object, the summary and construction of the invention are as follows:

(1) A method for evaluating a bonded wafer formed by directly bonding a wafer for active layer and a wafer for support substrate without an insulating film and thinning the wafer for active layer, which comprises steps of removing native oxide from a surface of an active layer in the bonded wafer, subjecting the bonded wafer to an etching with an etching liquid having an etching rate to a material constituting the wafer faster than that to an oxide of the material to remove at least a whole of the active layer, and detecting island-shaped oxides exposed by the etching, in which the etching is carried out so as to satisfy a relation of $T \leq X \leq T+500$ nm wherein T is a thickness of the active layer (nm) and X is an etching depth (nm) to detect the number and size of the island-shaped oxides.

(2) A method for evaluating a bonded wafer according to item (1), wherein the etching step is carried out by previously grasping a kind, concentration and temperature of the etching liquid used in the etching and then calculating an adequate etching time from the etching rates of the material constituting the wafer and the oxide thereof so as to render the etching depth X into the range of $T \leq X \leq T+500$ nm.

(3) A method for evaluating a bonded wafer according to item (1) or (2), wherein the etching liquid is an alkaline liquid of tetramethylammonium hydroxide, KOH or NaOH.

According to the invention, the method for the evaluation of the bonded wafer formed by directly bonding the wafer for active layer and the wafer for support substrate without the insulating film and then thinning the wafer for active layer comprises steps of removing native oxide from a surface of an active layer in the bonded wafer, subjecting the bonded wafer to an etching with an etching liquid having an etching rate to a material constituting the wafer faster than that to an oxide of the material to remove at least a whole of the active layer, and detecting island-shaped oxides exposed by the etching, in which the etching is carried out so as to satisfy a relation of $T \leq X \leq T+500$ nm wherein T is a thickness of the active layer (nm) and X is an etching depth (nm), whereby it is possible to detect the number and size of the island-shaped oxides at the bonded interface.

BRIEF DESCRIPTION OF THE DRAWINGS

FIG. 2 is a graph showing a relation between a concentration and an etching rate when tetramethylammonium hydroxide is used as an etching liquid, wherein FIG. 2(a) shows a relation between a concentration of tetramethylammonium hydroxide and an etching rate of silicon, FIG. 2(b) shows a relation between a concentration of tetramethylammonium hydroxide and an etching rate of an oxide, FIG. 2(c) shows a relation between a temperature of tetramethylammonium hydroxide and an etching rate of silicon and FIG. 2(d) shows a relation between a temperature of tetramethylammonium hydroxide and an etching rate of an oxide.

DESCRIPTION OF THE PREFERRED EMBODIMENTS

The method for evaluating the bonded wafer according to the invention will be described with reference to the accompanying drawings.

Figure 1:
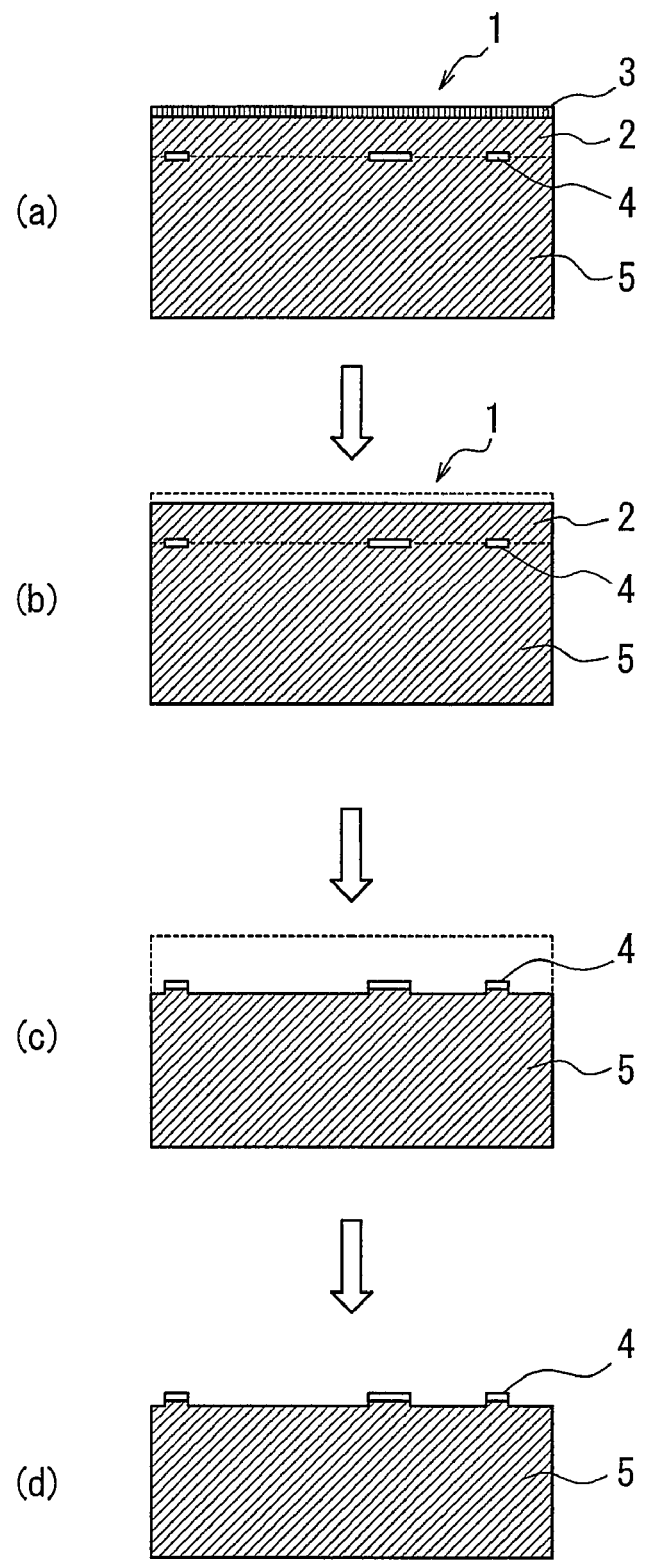
FIG. 1 is a flow chart illustrating steps in the evaluation method of the bonded wafer according to the invention.

FIG. 1 is a flow chart illustrating steps in the evaluation method of the bonded wafer according to the invention.

The evaluation method according to the invention is a method for evaluating a bonded wafer formed by directly bonding a wafer for active layer and a wafer for support substrate without an insulating film and then thinning the wafer for active layer. Concretely, as shown in FIG. 1, it is an evaluation method comprising a step of removing native oxide 3 from a surface of an active layer 2 in a bonded wafer (FIG. 1(a)) with, for example, a 0.5% HF liquid (FIG. 1(b)) (native oxide removing step), a step of subjecting the bonded wafer to an etching with an etching liquid having an etching rate to a material constituting the wafer such as silicon faster than that of an oxide of the material such as $SiO_2$ to remove at least a whole of the active layer (FIG. 1(c)) (etching step for removal of active layer), and a step of detecting island-shaped oxides exposed by the etching (FIG. 1(d)) (island-shaped oxide detecting step).

(Native Oxide Removing Step)

The native oxide removing step is a step of removing the native oxide 3 formed on the surface of the active layer 2 in the bonded wafer 1 (FIG. 1(a)) by etching with, for example, the 0.5% HF liquid as shown in FIG. 1(b). The concentration of the HF liquid used for the etching is not particularly limited, but is preferably 0.5-5%. Also, the treating time is dependent on the thickness of the native oxide and the concentration of the HF liquid, but is preferably 0.5-10 minutes.

(Etching Step for Removal of Active Layer)

Figure 2:
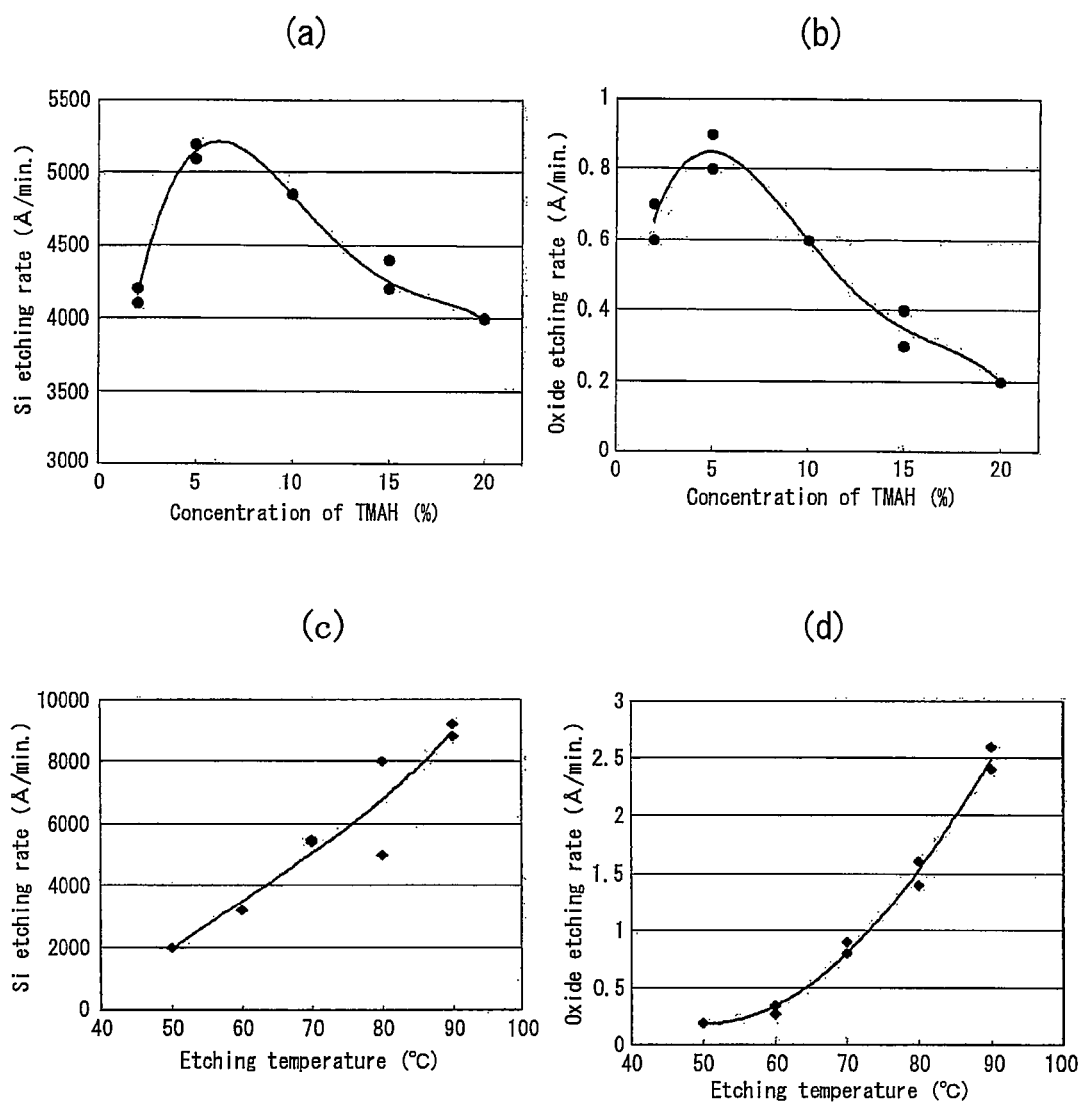

As shown in FIG. 1(c), the etching step for the removal of the active layer is a step of removing at least a whole of the active layer 2 by etching with the etching liquid having an etching rate to a material constituting the wafer, e.g. silicon faster than that of an oxide of the material, e.g. $SiO_2$. FIG. 2 is a graph showing an etching rate when tetramethylammonium hydroxide (TMAH) is used as an example of the etching liquid, wherein FIG. 2(a) shows a relation between a concentration of tetramethylammonium hydroxide (TMAH) and an etching rate of silicon at a liquid temperature of 70° C., and FIG. 2(b) shows a relation between a concentration of tetramethylammonium hydroxide and an etching rate of silicon oxide at a liquid temperature of 70° and FIG. 2(c) shows a relation between an etching temperature and an etching rate of silicon when the concentration of TMAH is 8%, and FIG. 2(d) shows a relation between an etching temperature and an etching rate of silicon oxide when the concentration of TMAH is 8%. From FIGS. 2(a)-(d), it can be understood that the etching rate of silicon is larger by several thousands times than that of the silicon oxide. In fact, when the bonded wafer is etched with the etching liquid such as tetramethylammonium hydroxide, the active layer 2 and the support substrate 5 each being made of silicon are removed at a faster etching rate, but the island-shaped oxides 4 are etched at a slower etching rate, so that the oxides are substantially retained without removing by etching as shown in FIG. 2(c). As a result, it becomes easy to detect scattered island-shaped oxides at the subsequent island-shaped oxide detecting step.

Also, it is required to conduct the etching of the active layer so as to satisfy a relation of $T \leq X \leq T+500$ nm wherein T is a thickness of the active layer (nm) and X is an etching depth (nm). Since it is known that the island-shaped oxides existing at the bonded interface in the bonded wafer formed by directly bonding the active layer and the support substrate without the insulating film badly affect the device, the inventors have noticed that it is necessary to confirm the presence or absence of the island-shaped oxides and further it is important to specify not only the number but also the size of the island-shaped oxides in point of grasping a zone of the device to be affected and made various studies on a method capable of detecting the size of the island-shaped oxide. As a result, it has been found out that the accurate number and size of the island-shaped oxides produced at the bonded interface can be specified by adjusting the etching depth so as to satisfy the relation of $T \leq X \leq T+500$ nm wherein T is a thickness of the active layer (nm) and X is an etching depth (nm).

Figure 3:
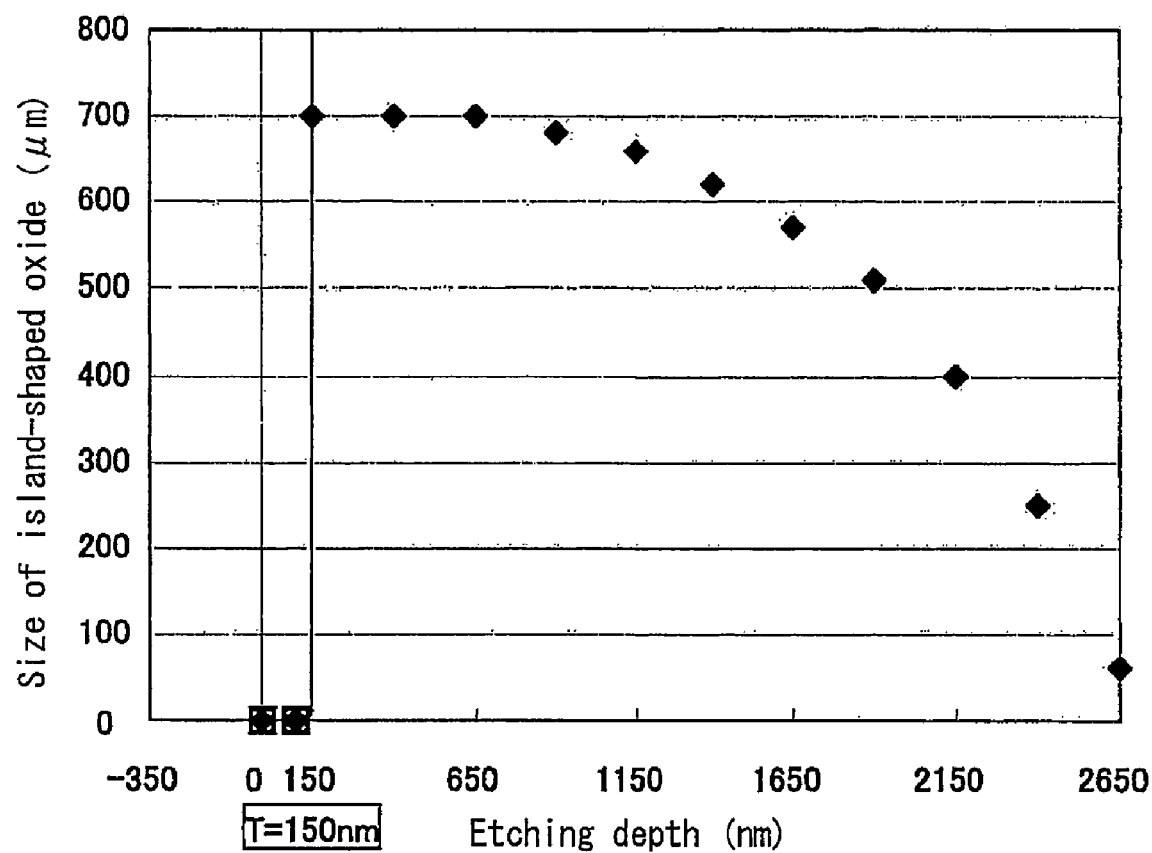
FIG. 3 is a graph showing a relation between an etching depth and a size of an island-shaped oxide in the etching of a bonded wafer having a thickness of an active layer of 150 nm.

The reason why the etching depth is limited to the range of $T \leq X \leq T+500$ nm is due to the fact that if the etching depth is smaller than the thickness of the active layer ($X<T$), the etching does not arrive at the bonded interface and the island-shaped oxides to be specified are not exposed, while if the etching depth exceeds a total thickness of the active layer thickness plus 500 nm ($X>T+500$ nm), the island-shaped oxides are miniaturized by the etching and hence the accurate size can not be specified. FIG. 3 is a graph showing a relation between an etching depth and a size of one island-shaped oxide existing at the bonded interface when the bonded wafer having a thickness of 150 nm is etched with an etching liquid containing 8% of tetramethylammonium hydroxide, from which it is understood that when the etching depth is less than 150 nm, the active layer is still etched and the island-shaped oxides are not yet exposed and hence the size of the oxide can not be specified, while when it exceeds 650 nm, the size of the island-shaped oxide becomes reduced though the size of the island-shaped oxide is constant at the etching depth of from 150 nm to 650 nm.

Further, it is preferable that the etching step is carried out by previously grasping a kind, concentration and temperature of the etching liquid used in the etching and then calculating an adequate etching time from the etching rates of the material constituting the wafer and the oxide thereof so as to render the etching depth X into the range of $T \leq X \leq T+500$ nm. Since the etching time is determined by the kind, concentration and temperature of the etching liquid, the data of the etching rate are previously stored with various liquids under various concentrations and temperatures, and the etching time required in the actual etching is calculated by cross-checking the actual etching conditions with the stored data. When the etching is conducted by this method, the required etching quantity can be controlled by the time and hence the etching depth can be easily adjusted to the range of $T \leq X \leq T+500$ nm. Furthermore, when the same material as the material constituting the wafer is simultaneously etched as a monitor to confirm the etching depth of the monitor within an adequate range, the etching quantity can be grasped further surely.

Moreover, as the etching liquid used in the etching step for the removal of active layer is preferable an alkali solution of tetramethylammonium hydroxide, KOH or NaOH. In case of using an etching solution other than the above liquid, the detection of the island-shaped oxides is difficult because there is no difference in the etching rate between silicon and oxide, or the silicon portion is excessively etched because the etching speed to silicon is too fast, so that the adequate evaluation can not be conducted.

(Detection Step of Island-shaped Oxides)

Figure 4:
FIG. 4 is an optical photomicrograph of island-shaped oxides exposed after the removal of an active layer by the etching method according to the invention as observed under a collecting lamp.

The detection step of island-shaped oxides is a step for detecting an island-shaped oxide 4 produced by the etching as shown in FIG. 1(d). The detection means is not particularly limited as long as it can specify the number and size of the island-shaped oxides. In general, the number of island-shaped oxides is measured by the visual observation on the appearance of the bonded wafer in a light focusing lamp, the observation with an optical microscope, the observation with a surface foreign inspecting device, or the like, while the size of the island-shaped oxide is measured by the observation with an optical microscope or an electron microscope. The observation results are shown in FIG. 4. As the other detection means can be used an electron probe microanalyzer (EPMA), scanning analysis electron microscope (SEM-EDX) and the like.

Although the above is merely explained with respect to the embodiment of the invention, various modification may be added within the scope of the invention.

EXAMPLE 1

In this example, two silicon wafers each having a size of 300 mm and a crystal orientation of (100) are used as a wafer for active layer and a wafer for support substrate, respectively. An ion implanted layer is formed in an inside of the wafer for active layer by implanting hydrogen ions. Thereafter, the wafer for active layer is directly bonded at the ion implanted surface to the wafer for support substrate without using an oxide film, which is subjected to an exfoliation heat treatment to partly exfoliate the wafer for active layer at the ion implanted layer as an exfoliation face. After the exfoliation, the removal of damaged portions at the surface of the active layer and the planarization are carried out by a heat treatment to prepare a sample for the evaluation of an insulating film-free bonded wafer having an active layer thickness of 150 nm.

EXAMPLE 2

In this example, a silicon wafer having a size of 300 mm and a crystal orientation of (110) as a wafer for active layer is directly bonded to a silicon wafer having a size of 300 mm and a crystal orientation of (100) as a wafer for support substrate without using an oxide film, which is then subjected to a heat treatment of 1200° C. for increasing the bonding force. Thereafter, the wafer for active layer is thinned by grinding, polishing and etching and further the removal of damaged portions at the surface of the active layer and the planarization are carried out by a heat treatment to prepare a sample for the evaluation of an insulating film-free bonded wafer having an active layer thickness of 1000 nm.

(Evaluation Method)

Figure 5:
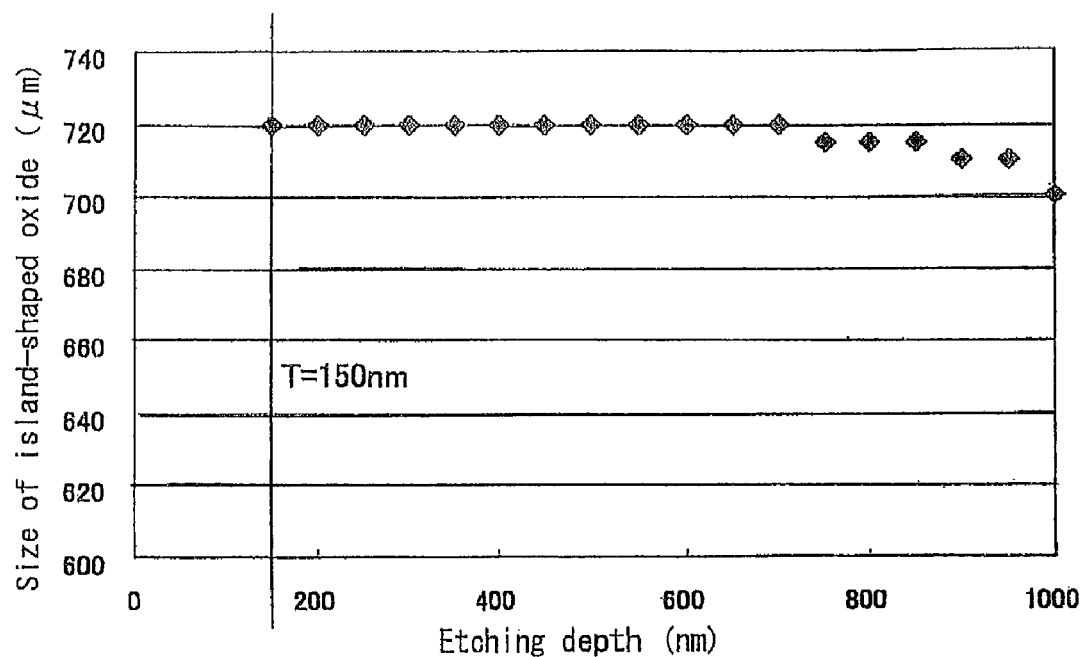
FIG. 5 is a graph showing a relation between an etching depth and a size of an island-shaped oxide measured in Example 1.
Figure 6:
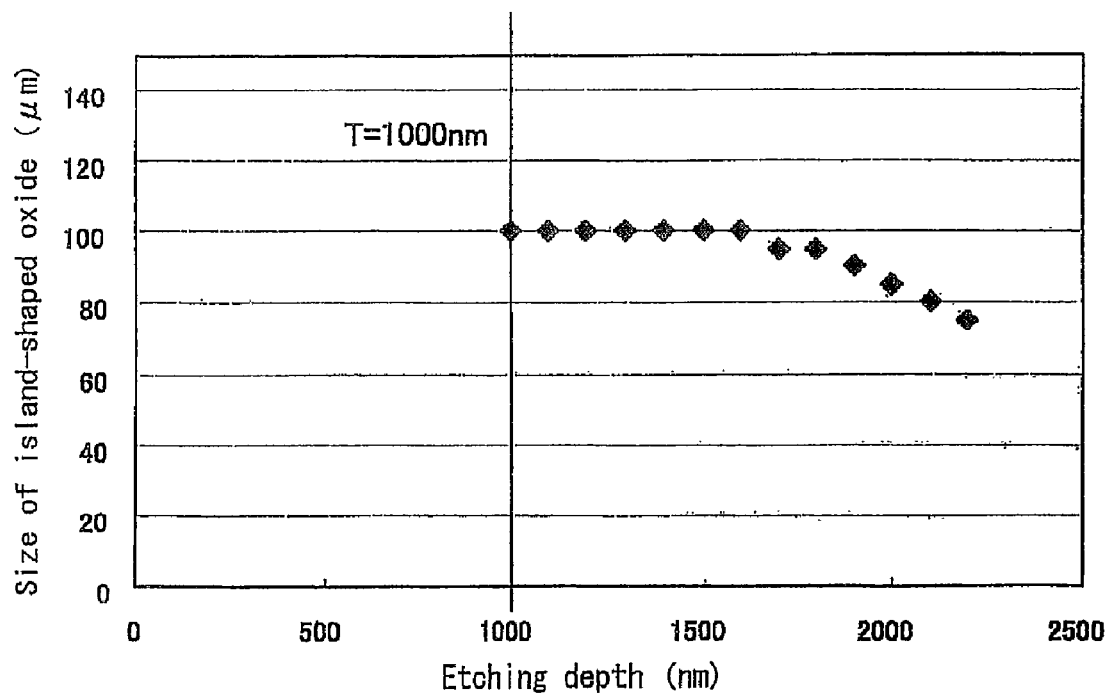
FIG. 6 is a graph showing a relation between an etching depth and a size of an island-shaped oxide measured in Example 2.

The thus obtained evaluation samples are cleaned with an aqueous solution of 5% HF for 10 minutes to remove native oxide film from the surface thereof and then subjected at the surface of the active layer to an etching treatment with an aqueous solution of 8% tetramethylammonium hydroxide (TMAH). In the sample of Example 1, the etching is conducted every 50 nm of a depth from the surface of the active layer to measure the number and the size of island-shaped oxides with an optical microscope (20-1000 magnification). In the sample of Example 2, the etching is conducted every 100 nm of a depth from a position of 800 nm corresponding to a depth previously etched off from the surface of the active layer to measure the number and the size of island-shaped oxides with an optical microscope (20-1000 magnification). The measured results on the etching depth and the number and size of island-shaped oxides with respect to the samples of Examples 1 and 2 are shown in Tables 1 and 2, respectively, and graphs of such results are shown in FIGS. 5 and 6.

TABLE 1

Results measured in Example 1 (number and size of island-shaped oxides)

| | Etching depth (nm) | Number of island-shaped oxides (oxides/cm$^2$) | Average size of island-shaped oxide (μm) |
|---|---|---|---|
| 1 | 0 | — | — |
| 2 | 50 | — | — |
| 3 | 100 | — | — |
| 4 | 150 | 17.5 | 720 |
| 5 | 200 | 17.5 | 720 |
| 6 | 250 | 17.5 | 720 |
| 7 | 300 | 17.5 | 720 |
| 8 | 350 | 17.5 | 720 |
| 9 | 400 | 17.5 | 720 |
| 10 | 450 | 17.5 | 720 |
| 11 | 500 | 17.5 | 720 |
| 12 | 550 | 17.5 | 720 |
| 13 | 600 | 17.5 | 720 |
| 14 | 650 | 17.5 | 720 |
| 15 | 700 | 17.5 | 720 |
| 16 | 750 | 17.5 | 715 |
| 17 | 800 | 17.5 | 715 |
| 18 | 850 | 17.5 | 715 |
| 19 | 900 | 17.5 | 710 |
| 20 | 950 | 17.5 | 710 |
| 21 | 1000 | 17.5 | 700 |

TABLE 2

Results measured in Example 2 (number and size of island-shaped oxides)

| | Etching depth (nm) | Number of island-shaped oxides (oxides/cm$^2$) | Average size of island-shaped oxide (μm) |
|---|---|---|---|
| 1 | 0 | — | — |
| 2 | 800 | — | — |
| 3 | 900 | — | — |
| 4 | 1000 | 7.7 | 100 |
| 5 | 1100 | 7.7 | 100 |
| 6 | 1200 | 7.7 | 100 |
| 7 | 1300 | 7.7 | 100 |
| 8 | 1400 | 7.7 | 100 |
| 9 | 1500 | 7.7 | 100 |
| 10 | 1600 | 7.7 | 100 |
| 11 | 1700 | 7.7 | 95 |
| 12 | 1800 | 7.7 | 95 |
| 13 | 1900 | 7.7 | 90 |
| 14 | 2000 | 7.7 | 85 |
| 15 | 2100 | 7.5 | 80 |
| 16 | 2200 | 7.2 | 75 |

As seen from the results of Tables 1 and 2, the presence or absence and the size of the island-shaped oxides existing in the bonded interface of the bonded wafer can be confirmed when the etching depth becomes the same as the thickness of the active layer. Also, it is understood that the number and size of the island-shaped oxides are unchangeable and constant until the etching depth reaches the thickness of the active layer plus 550 nm in Examples 1 and the thickness of the active layer plus 600 nm in Example 2 but when the etching depth exceeds the above total value, the number and size of the island-shaped oxides become small.

According to the invention, it is possible to detect the number and size of the island-shaped oxides at the bonded interface by the evaluation method of the bonded wafer formed by directly bonding the wafer for active layer and the wafer for support substrate without the insulating film and then thinning the wafer for active layer, which comprises steps of removing native oxide from a surface of an active layer in the bonded wafer, subjecting the bonded wafer to an etching with an etching liquid having an etching rate to a material constituting the wafer faster than that to an oxide of the material to remove at least a whole of the active layer, and detecting island-shaped oxides exposed by the etching, in which the etching is carried out so as to satisfy a relation of $T \leq X \leq T+500$ nm wherein T is a thickness of the active layer (nm) and X is an etching depth (nm).

What is claimed is:

1. A method for evaluating a bonded wafer formed by directly bonding a wafer for active layer and a wafer for support substrate without an insulating film and thinning the wafer for active layer, which comprises steps of removing native oxide from a surface of an active layer in the bonded wafer, subjecting the bonded wafer to an etching with an etching liquid having an etching rate to a material constituting the wafer faster than that to an oxide of the material to remove at least a whole of the active layer, and detecting island-shaped oxides exposed by the etching, in which the etching is carried out so as to satisfy a relation of $T \leq X \leq T+500$ nm wherein T is a thickness of the active layer (nm) and X is an etching depth (nm) to detect the number and size of the island-shaped oxides.

2. A method for evaluating a bonded wafer according to claim 1, wherein the etching step is carried out by previously grasping a kind, concentration and temperature of the etching liquid used in the etching and then calculating an adequate etching time from the etching rates of the material constituting the wafer and the oxide thereof so as to render the etching depth X into the range of $T \leq X \leq T+500$ nm.

3. A method for evaluating a bonded wafer according to claim 1, wherein the etching liquid is an alkaline liquid of tetramethylammonium hydroxide, KOH or NaOH.

4. A method for evaluating a bonded wafer according to claim 2, wherein the etching liquid is an alkaline liquid of tetramethylammonium hydroxide, KOH or NaOH.

* * * * *